United States Patent
Turner (10) Patent No.: US 6,269,020 B1
(45) Date of Patent: Jul. 31, 2001

(54) FIFO CONFIGURATION CELL

(75) Inventor: John Turner, Santa Cruz, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/245,428

(22) Filed: Feb. 5, 1999

Related U.S. Application Data (60) Provisional application No. 60/076,009, filed on Feb. 26, 1998.

(51) Int. Cl.[7] .................................................. G11C 11/00
(52) U.S. Cl. ............................ 365/154; 365/156; 365/221
(58) Field of Search .................................... 365/154, 156, 365/221

(56) References Cited

U.S. PATENT DOCUMENTS

| | | | |
|---|---|---|---|
| 4,879,687 | 11/1989 | Okamoto et al. | 365/200 |
| 5,280,201 | 1/1994 | Fujimori et al. | 307/448 |
| 5,325,325 | 6/1994 | Azuma | 365/156 |
| 5,479,369 | 12/1995 | Matsumura et al. | 365/189.05 |
| 5,764,564 | 6/1998 | Frake et al. | 365/154 |
| 5,870,331 | 2/1999 | Hwang et al. | 365/154 |

*Primary Examiner*—Son T. Dinh
(74) *Attorney, Agent, or Firm*—Morrison & Foerster LLP (57) ABSTRACT

A memory cell and a method of writing to a memory cell where a switch couples the output of a latch cell to a predetermined potential in response to a data signal and a control signal is disclosed. In one embodiment the switch includes two transistors, wherein the first transistor is responsive to the data signal and the second transistor is responsive to the control signal, the two transistors coupled such that when both transistors are on the output of the latch is connected to the predetermined potential. In another embodiment the switch includes a transistor and an inverter wherein the transistor is responsive to the control signal and the inverter is connected to the data signal between the data signal input and the output of the latch cell.

53 Claims, 5 Drawing Sheets

FIFO CONFIGURATION CELL

CROSS-REFERENCE TO RELATED APPLICATIONS

This application claims the benefit of U.S. Provisional application Ser. No. 60/076,009, filed Feb. 26, 1998, and titled "FIFO CONFIGURATION CELL".

BACKGROUND

1. Field of the Invention

The present invention relates to static random access memory circuits, and more particularly to static random access memory circuits that are especially suitable for programmable logic integrated circuit devices.

2. Description of the Related Art

Figure 1:
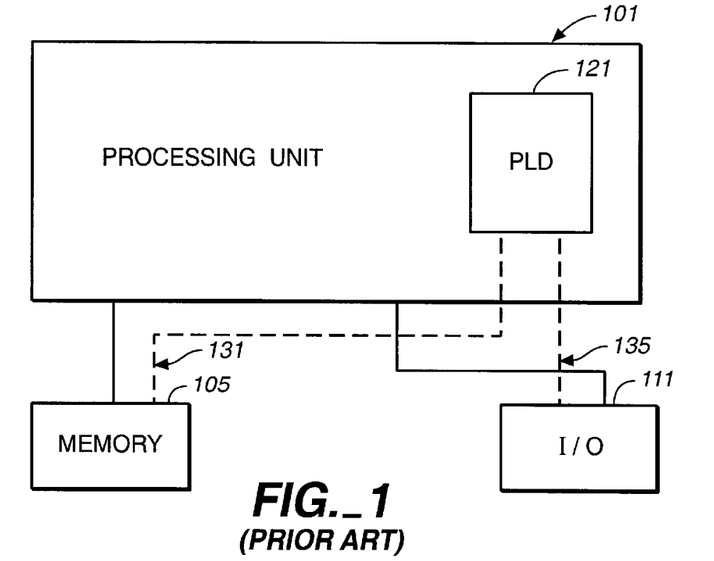
FIG. 1 is a block diagram of a digital system incorporating a programmable logic integrated circuit.

FIG. 1 shows a block diagram of a digital system within which the present invention may be embodied. The system may be provided on a single board, on multiple boards, or even within multiple enclosures. FIG. 1 illustrates a system (101) in which a programmable logic device (121) may be utilized. Programmable logic devices (sometimes referred to as a PALs, PLAs, FPLAs, PLDs, EPLDs, EEPLDs, LCAs, or FPGAs), are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated herein by reference. Such devices are currently represented by, for example, Altera's MAX® series of PLDs and FLEX® series of PLDs. The former are described in, for example, U.S. Pat. Nos. 5,241,224 and 4,871,930, and the *Altera Data Book,* June 1996, all incorporated herein by reference. The latter are described in, for example, U.S. Pat. Nos. 5,258,668, 5,260,610, 5,260,611, and 5,436,575, and the *Altera Data Book,* June 1996, all incorporated herein by reference. Logic devices and their operation are well known to those of skill in the art.

In the particular embodiment of FIG. 1, a processing unit (101) is coupled to a memory (105) and an I/O (111) and incorporates a programmable logic device (PLD) (121). PLD (121) may be specifically coupled to memory (105) through connection (131) and to I/O (111) through connection (135). The system may be a programmed digital computer system, digital signal processing system, specialized digital switching network, or other processing system. Moreover, such systems may be designed for a variety of applications such as, merely by way of example, telecommunications systems, automotive systems, control systems, consumer electronics, personal computers, and others.

Processing unit (101) may direct data to an appropriate system component for processing or storage, execute a program stored in memory (105) or input using I/O (111), or perform other similar functions. Processing unit (101) may be a central processing unit (CPU), microprocessor, floating point coprocessor, graphics coprocessor, hardware controller, microcontroller, digital signal processor (DSP) or programmable logic device programmed for use as a controller, or other processing unit. Furthermore, in many embodiments, there is often no need for a CPU. For example, instead of a CPU, one or more PLDs (121) may control the logical operations of the system. In some embodiments, processing unit (101) may be a computer system. Memory (105) may be a random access memory (RAM), read only memory (ROM), fixed or flexible disk media, PC Card flash disk memory, tape, or any other storage retrieval means, or any combination of these storage retrieval means. PLD (121) may serve many different purposes within the system in FIG. 1. PLD (121) may be a logical building block of processing unit (101), supporting its internal and external operations. PLD (121) is programmed to implement the logical functions necessary to carry out its particular role in system operation.

Figure 2:
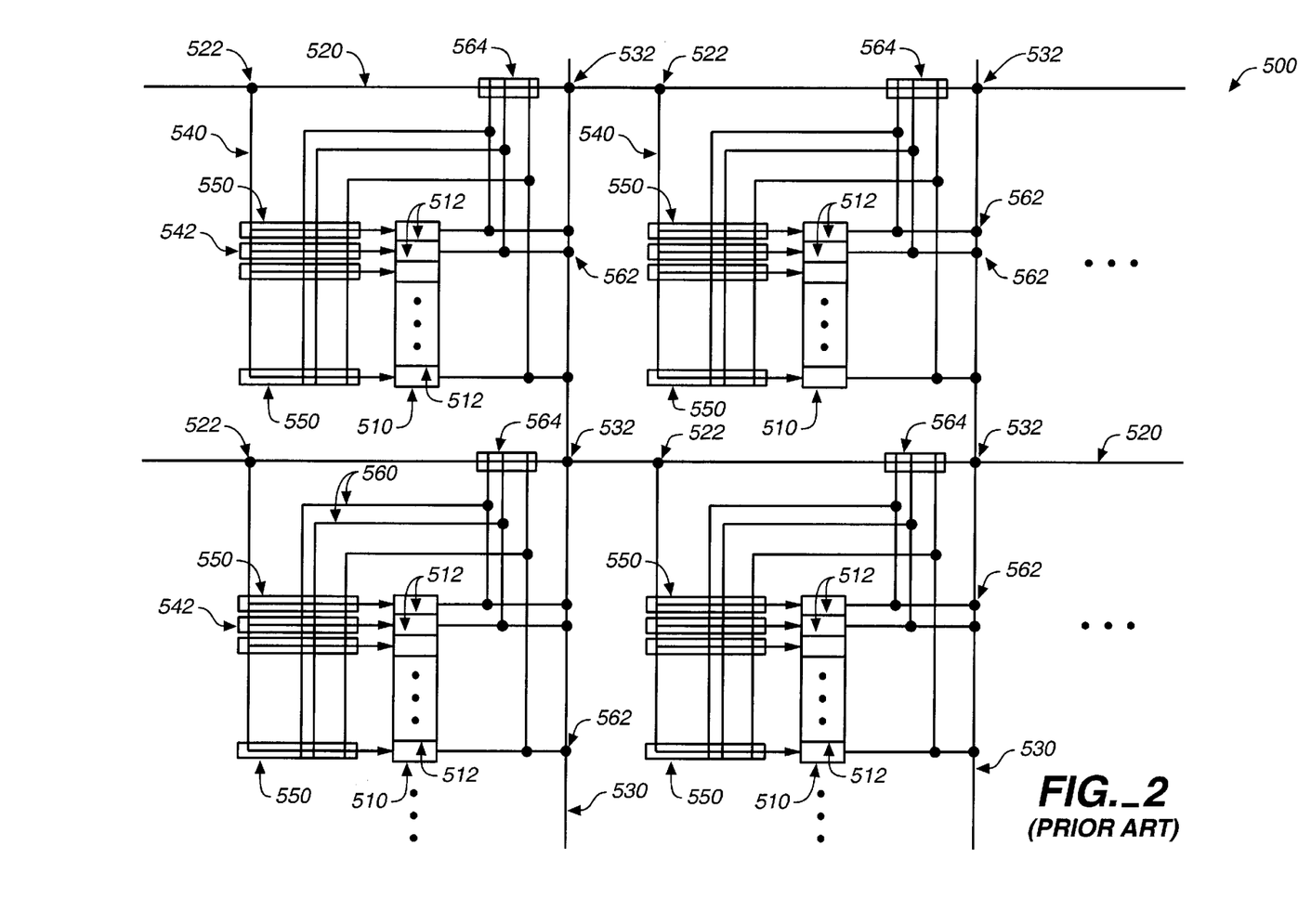
FIG. 2 is a simplified schematic block diagram of a representative portion of illustrative conventional programmable logic device circuitry with which this invention can be used.

One example of a known PLD (500) is shown in FIG. 2. Device (500) may be generally like the PLD shown and described in U.S. Pat. No. 5,689,195, issued to Cliff et al., which is hereby incorporated by reference herein. Device (500) includes a plurality of regions (510) of programmable logic disposed on the device in a two-dimensional array of intersecting rows and columns of such regions. Each region includes a plurality of subregions (512) of programmable logic. For example, each subregion (512) may include a four-input look-up table. The table is programmable to produce a "combinatorial" output signal, which can be any logical combination of four input signals applied to the look-up table. Each subregion (512) may additionally include a register (e.g., a flip-flop) for selectively registering (storing) the combinatorial output signal to produce a registered output signal. And each subregion (512) may include programmable logic connectors ("PLCs") for programmably selecting either the combinatorial or registered output signal as the final output signal of the subregion.

A plurality of horizontal interconnection conductors (520) is associated with each row of regions (510) for conveying signals to, from, and/or between the regions in the associated row. A plurality of vertical interconnection conductors (530) is associated with each column of regions (510) for conveying signals to, from, and/or between the various rows. A plurality of local conductors (540) is associated with each region (510) for making selected signals on the adjacent horizontal conductors (520) available to the associated region.

PLCs (522) are provided for making programmable connections between selected intersecting conductors (520) and (540). A plurality of subregion feeding conductors (550) is associated with each subregion (512) for applying selected signals on the adjacent conductors (540) (and adjacent local feedback conductors (560) (described below)) to the associated subregion. PLCs (542) are provided for making programmable connections between intersecting conductors (540), (560) and (550). The output signal of each subregion (512) can be applied to selected adjacent vertical conductors via PLCs (562) and/or to selected horizontal conductors (520) via PLCs (564). The output signal of each subregion (512) is also made available as a local feedback signal (via a conductor (560)) to all of the subregions in the region (510) that includes that subregion. Selected intersecting horizontal and vertical conductors are programmably interconnectable by PLCs (532).

Figure 3:
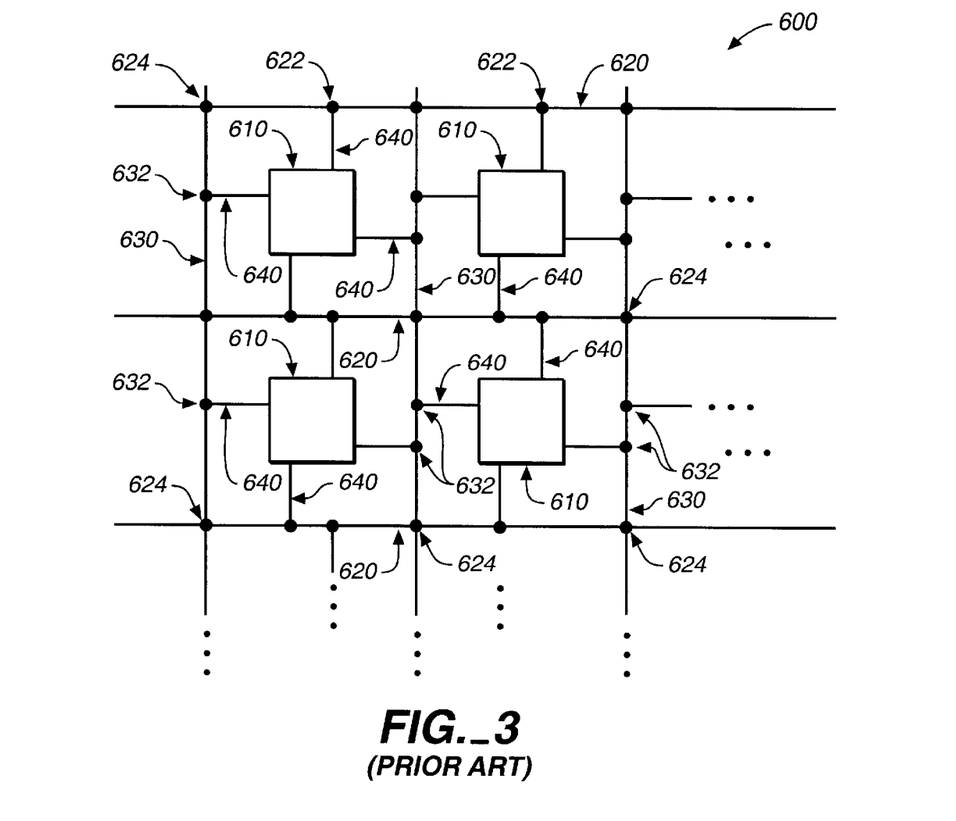
FIG. 3 is similar to FIG. 2, but for another example of conventional programmable logic device circuitry with which the invention can be used.

Another example of a known PLD (600) is shown in FIG. 3. Device (600) may be generally like the PLDs shown in U.S. Pat. No. Re. 34,363, issued to Freeman, which is also hereby incorporated by reference herein. Device (600) includes a plurality of configurable logic blocks ("CLBs") (610) disposed on the device in a two-dimensional array of intersecting rows and columns of CLBs. Each CLB (610) may include one or two small, programmable, look-up tables and other circuitry such as a register and PLCs for routing signals within the CLB. A plurality of horizontal interconnection conductor tracks (620) are disposed above and below each row of CLBs (610). A plurality of vertical interconnection conductor tracks (630) are disposed to the left and right of each column of CLBs (610). Local conductors (640) are provided for bringing signals into each CLB (610) from selected conductor tracks (620),(630) adjacent to each side of the CLB and/or for applying signals from the CLB to selected adjacent conductor tracks (620), (630). PLCs (622),(632) are provided for making programmable connections between selected intersecting conductors (620),(630) and (640). PLCs (624) are provided for making programmable connections between selected conductors segments in tracks (620) and/or (630) that intersect or otherwise come together at the locations of those PLCs. Programming of the programmable elements in devices of this type employs shift registers, where each shift register controls an associated logic or switching element. Programming data is shifted through the shift register or registers until the data desired for controlling each logic or switching element is stored in the shift register stage associated with that element. A disadvantage of this approach is that shift registers are relatively complex and require substantial numbers of conductors for interstage data transfer, clocking, etc.

In programmable logic devices such as that shown in FIG. 2, first-in/first-out ("FIFO") chains of static random access memory ("SRAM") cells are commonly used on the device for programmable control of the configuration of the device. For example, the SRAM cells in such FIFO chains may be used to control the logic performed by each subregion (512) (e.g., by constituting or controlling the data stored in the look-up tables in those components and controlling the connections made by the PLCs in those components). The SRAM cells in the FIFO chains may also be used to control the connections made by the various interconnection conductor PLCs (e.g., PLCs 522, 532, 542, 562, and 564) on the device. FIFO chains have an advantage over shift register programming as the FIFO chains have a simpler programming structure. A typical technique for programming the programmable elements in devices using FIFO chains is shown, for example, in U.S. Pat. No. 5,237,219, issued to Cliff, which is hereby incorporated by reference herein. A typical prior art FIFO SRAM chain (710) will now be described with reference to FIG. 4.

Figure 4:
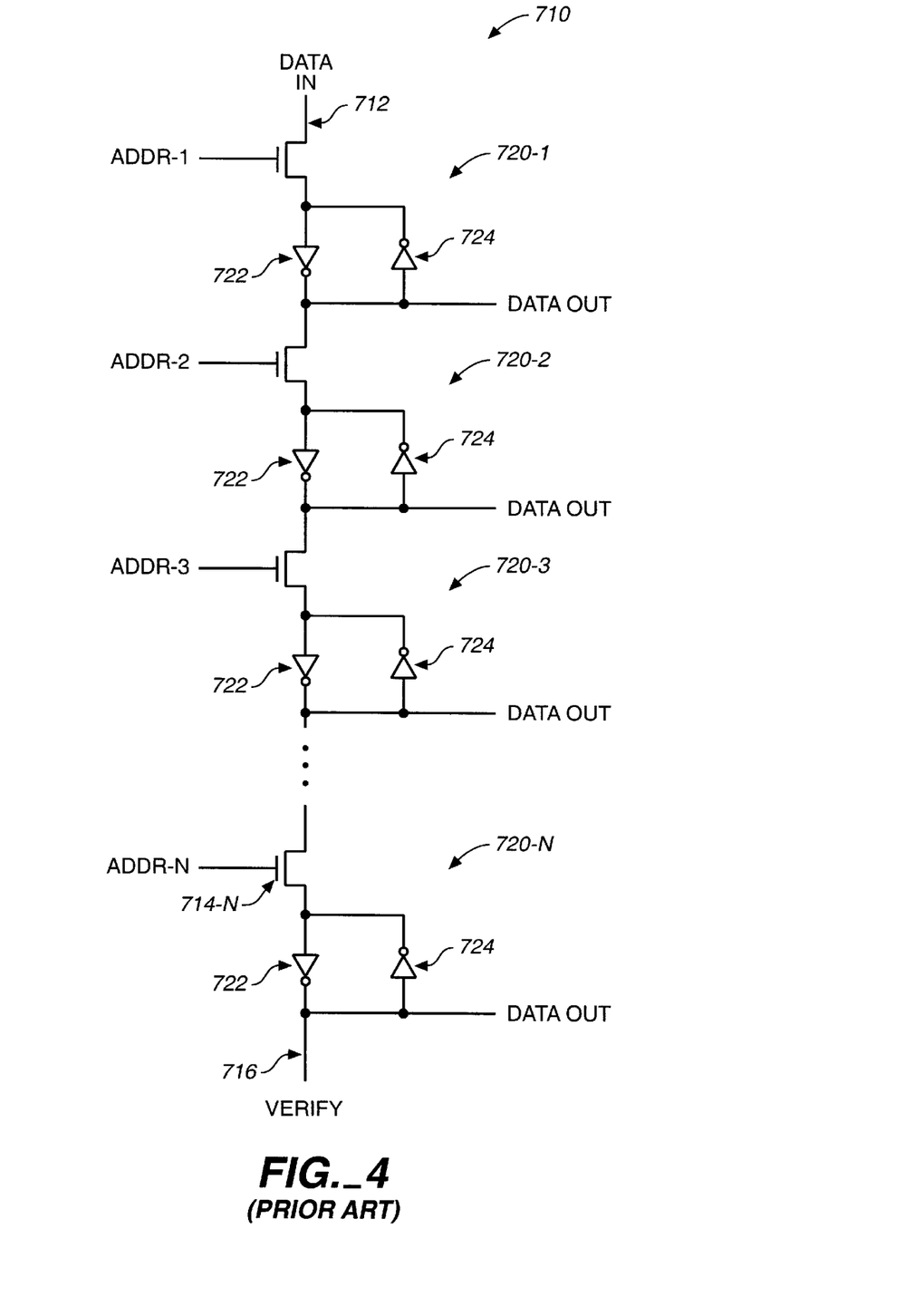
FIG. 4 is a simplified schematic diagram of a conventional FIFO SRAM chain.

In the FIFO SRAM chain (710) shown in FIG. 4, each SRAM cell (720) includes a relatively strong, forwardly directed driver inverter (722) connected in a closed loop series with a relatively weak, backwardly directed feedback inverter (724). In the absence of a signal passed from above by an NMOS pass gate (714), each feedback inverter (724) is strong enough to hold the associated driver inverter (722) in whatever state it was left by the most recent signal passed by the pass gate (714) immediately above. On the other hand, each feedback inverter (724) is not strong enough to prevent the associated driver inverter (722) from responding to any signal passed by the pass gate (714) immediately above.

Programming data is applied to FIFO chain (710) via DATA IN line (712) at the start of the chain. Initially all of pass gates (714) are enabled by address signals ADDR-1 through ADDR-N. This allows the first programming data bit to pass all the way down the chain (inverted by each successive driver inverter (722) that it passes through) until it reaches and is stored in cell (720-N).

Pass gate (714-N) is then turned off by changing the ADDR-N signal to logic 0. The next programming data bit from line (712) therefore passes down the chain until it reaches and is stored in the cell (720-(N−1)) immediately above cell (720-N) (not shown but similar to all other cells (720)). The NMOS pass gate (714) above the cell (720-(N−1)) is then turned off and the next programming data bit is applied to the DATA IN line (712). This process continues until all of cells (720) have been programmed and all of pass gates (714) have been turned off. Each cell (720) outputs the data it stores via its DATA OUT line. These DATA OUT signals may be used to control various aspects of the operation of a programmable logic device that includes chain (710). For example, a DATA OUT signal from chain (710) may control a programmable aspect of the "architecture" of the programmable logic device (e.g., which of several available clock or clear signals a register in a subregion (512) (FIG. 2). Or a DATA OUT signal from chain (710) may control a programmable aspect of the logic performed by the device (e.g., by being a datum in a look-up table in a subregion (512) or a CLB (610)). As still another example, a DATA OUT signal from chain (710) may control an interconnection conductor PLC (e.g., a PLC 522, 532, etc. (FIG. 1)) on the device.

The contents of chain (710) may be verified by using the ADDR signals to enable pass gates (714) progressively from the bottom up. This allows the data in cells (720) to be read out one after another from the bottom up via VERIFY lead (716).

It will be apparent from the foregoing that in order to program or verify chain (710) each NMOS pass gate (714) must be able to effectively pass both logic 0 and logic 1 signals. When circuit components are made very small (as is becoming possible as a result of ongoing advances in the techniques for semiconductor fabrication) and VCC (the power voltage used for logic 1 signals) is accordingly reduced, an NMOS pass gate (714) may not be able to pass a logic 1 signal that is sufficiently strong to overwrite the logic 0 output of the feedback inverter (724) below it unless the pass gate is made undesirably large. Thus PMOS pass gate does not pass logic 0 very well under the above-described conditions that reduce the effectiveness of an NMOS pass gate in passing logic 1. FIFO SRAM chains are therefore becoming less satisfactory for use as the programmable elements in products such as programmable logic devices.

Accordingly, it is desired that the present invention overcome the limitations of current FIFO cells and related programmable logic devices.

SUMMARY OF THE INVENTION

A memory cell having a switch for connecting an output of a latch cell to a predetermined potential where the switch is responsive to a data signal and a control signal. In one embodiment of the present invention the switch includes a data select line pull down transistor having its gate connected to the data-in line of the memory cell and a row select line pull down transistor having its gate connected to the row select line. The data-in line pull down transistor and the row select line pull down transistor are coupled together such that when both transistors are turned on the output of the latch cell is pulled down by connection to a predetermined voltage low.

In an another embodiment of the present invention the switch includes a row select line pull down transistor and a pull down inverter. The gate of the row select line pull down transistor is connected to the row select line. The source of the row select line pull down transistor is connected to the output of the latch cell. The drain of the row select line pull down transistor is connected to the output of the pull down inverter. The input of the pull down inverter is connected to the data-in line. The output of the latch cell is connected to the predetermined output of the pull down inverter when the row select line pull down transistor is turned on in response to the control signal received on the row select line.

In another embodiment of the present invention the switch includes a data select line pull up transistor having its gate connected to the data-in line of the memory cell and a row select line pull up transistor having its gate connected to the row select line. The data-in line pull up transistor and the row select line pull up transistor are coupled together such that when both transistors are turned on the output of the latch cell is pulled high by connection to a predetermined voltage high.

In an another embodiment of the present invention the switch includes a row select line pull up transistor and a pull up inverter. The gate of the row select line pull up transistor is connected to the row select line. The source of the row select line pull up transistor is connected to the output of the latch cell. The drain of the row select line pull up transistor is connected to the output of the pull up inverter. The input of the pull up inverter is connected to the data-in line. The output of the latch cell is connected to the predetermined output of the pull up inverter when the row select line pull up transistor is turned on in response to the control signal received on the row select line.

DETAILED DESCRIPTION OF THE INVENTION

The present invention provides a FIFO cell used in a programmable logic device. In the following description, numerous details are set forth in order to enable a thorough understanding of the present invention. However, it will be understood by those of ordinary skill in the art that these specific details are not required in order to practice the invention. Further, well-known elements, devices, process steps and the like are not set forth in detail in order to avoid obscuring the present invention.

In the following figures like objects are given the same numbers in an effort to aid the reader in understanding the features of the present invention.

Figure 5:
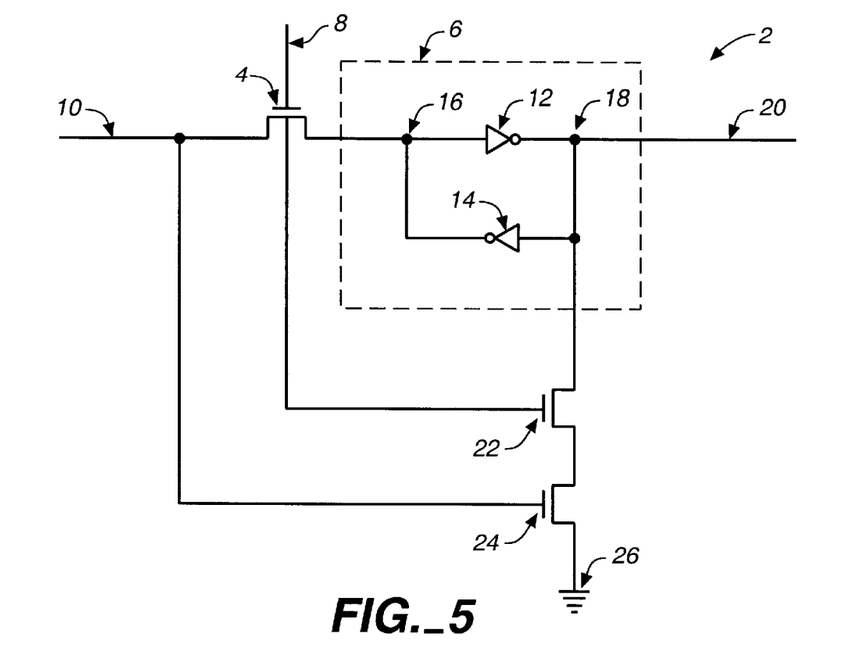
FIG. 5 is a schematic diagram of a FIFO cell having two pull down transistors, in accordance with the present invention.

FIG. 5 is a schematic diagram of a FIFO cell (2) having a row select pull down transistor (22) and a line-in pull down transistor (24), in accordance with the present invention. The FIFO cell (2) has a single pass gate transistor (4) and a latch cell (6). Typically, the pass gate transistor (4) is an NMOS transistor. The gate of the pass gate transistor (4) is connected to a row select line (8). The source of the pass gate transistor (4) is connected to a data-in line (10). The drain of the pass gate transistor (4) is connected to an input of the latch cell (6). When the pass gate transistor (4) is turned on, i.e. when the gate of the NMOS transistor is raised high to allow the transistor to pass signals through the transistor, then the data-in line (10) is electrically connected to the input of the latch cell (6). In this manner, the row select line (8) is used to "turn on" the pass gate transistor (4) to allow a digital "1" or a digital "0" to be written into the latch cell (6).

The latch cell (6) consists of a driver inverter (12) and a feedback inverter (14) cross coupled such that the output of one inverter is connected to the input of the other inverter. The latch cell (6) has an input node (16), which connects to the input of the driver inverter (12) and to the output of the feedback inverter (14). An output node (18) connects to the output of the driver inverter (12) and to the input of the feedback inverter (14). The inverters are standard CMOS inverters, where each typically consists of an NMOS transistor and a PMOS transistor.

The source of the row select pull down transistor (22) is connected to the output node (18). The gate of the row select pull down transistor (22) is connected to the row select line (8). The drain of the row select pull down transistor (22) is connected to the source of the data-in line pull down transistor (24). The gate of the data-in line pull down transistor (24) is connected to the data-in line (10). The drain of the data-in line pull down transistor (24) is connected to a voltage low (26), typically electrical ground. In this manner, the row select pull down transistor (22) and the data-in line pull down transistor (24) act as a switch to connect the output node (18) of the latch cell to the voltage low (26).

While the above embodiment connected the output node of the latch cell to ground, other embodiments could connect to a voltage source which provides a predetermined voltage low.

Typically, a FIFO cell as shown in FIG. 5 is connected in a chain of like cells such that the data-out line of one cell is connected to the data-in line of a neighboring cell. The progression of data through the chain is controlled by a control signal applied on the row select line for each cell. FIFO chains are used in programmable logic devices, as shown in FIGS. 2 and 3 wherein regions of configurable logic are programmably interconnected with programmable logic connectors, for programmable control of the configuration of the device. Programmable logic devices are used within digital systems, as shown in FIG. 1, which allow a user to electrically program standard, off-the-shelf logic elements to meet a user's specific needs.

When a digital "1" (or logic "1") is written to the FIFO cell (2) shown in FIG. 5, a voltage high, representing a digital "1," is input to the cell on the data-in line (10). The pass gate transistor (4) is turned on to allow writing to the cell by applying the control signal, represented by a voltage high, on the row select line (8) to the gate of the NMOS pass gate transistor (4). The turning on of the pass gate transistor (4) raises the voltage of the input node (16) of the latch cell (6). This voltage high is input to the driver inverter (12). The output from the driver inverter (12) is then a voltage low, which is input to the feedback inverter (14) and which pulls down the output node (18).

The voltage high on the data-in line (10) turns on the data-in line pull down transistor (24). The voltage high of the control signal on the row select line (8) turns on the row select line pull down transistor (22). When both the row select line pull down transistor (22) and the data-in line pull down transistor (24) are turned on, the output node (18) is electrically connected to ground (26). In this manner, the voltage of the output node (18) is pulled down by connecting the output node (18) to a voltage low, such as electrical ground (26), and by the voltage low output the driver inverter (12). When the output node (18) is pulled down, a voltage low is input to the feedback inverter (14). Accordingly, the output of the feedback inverter (18) is a voltage high, which raises the input node (16). Thus, the feedback inverter maintains the voltage high at the input node (16). In this manner, a digital "1" is written to the latch cell (6).

Similarly, a digital "0" (or logic "0") is written to the FIFO cell (2) shown in FIG. 5 by providing a voltage low on the data-in line (10). A control signal in the form of a voltage high on the row select line (8) turns on the NMOS pass gate transistor (4) and allows the voltage low to pass through the pass gate transistor (4) to the input node (16) of the latch cell (6). The voltage low at the input node (16) is input the driver inverter (12). The driver inverter (12) outputs a voltage high to the output node (18) and to the feedback inverter (14). The feedback inverter (14) outputs a voltage low to the input node (16). Thus, the feedback inverter maintains the voltage low at the input node (16). The voltage low on the data-in line (10) keeps the data-in line pull down transistor (24) closed when writing a digital "0" to the latch cell (6). When the data-in line pull down transistor (24) is closed, the output node (18) of the latch cell (6) is electrically insulated from ground (26). This allows the output node (18) of the latch cell (6) to be high when writing a digital "0" to the latch cell.

If a digital "0" was previously written to the latch cell (6), the writing of a digital "1" to the cell must overcome the voltage low at the input node (16). This voltage low in sustained by the feedback inverter (14). To "flip" the cell the output node (18) is pulled down by turning on both the row select line pull down transistor (22) and the data-in line pull down transistor (24), thereby connecting the output node (18) to ground (26). Once the output node (18) is pulled down, the output of the feedback inverter (14) is a voltage high. The voltage high output from the feedback inverter (14), along with the voltage high from the data-in line (10), raises the input node (16). Once the input node (16) has been raised, the latch cell (6) has been "flipped" and a digital "1" has been written into the FIFO cell (2). In this manner, a "1" has been latched into the latch cell (6).

The FIFO cell (2) shown in FIG. 5 has several advantages over the prior art FIFO cells discussed above. As the cell is flipped when writing a digital "1" by pulling down the output node of the latch cell by connecting the latch cell to ground, the driver inverter need not overpower the feedback inverter to successfully flip the cell. This has the advantage of allowing short channel CMOS transistors to be used for the feedback inverter (14). Accordingly, this allows the area of the feedback inverter to be reduced.

Another advantage of the present FIFO cell is that the pass gate transistor can be constructed with a higher impedance since the latch cell can be flipped with a reduced current through the pass gate transistor as compared to conventional FIFO cells This allows a smaller NMOS transistor to be used for the pass gate transistor.

By using short channel CMOS transistors in the feedback inverter and a smaller NMOS transistor for the pass gate transistor, the total area of the cell can be reduced despite the inclusion of the two additional pull down transistors. Additionally, the present design allows for efficient and reliable operation of the cell in writing both a digital "1" and a digital "0" to the cell.

Figure 6:
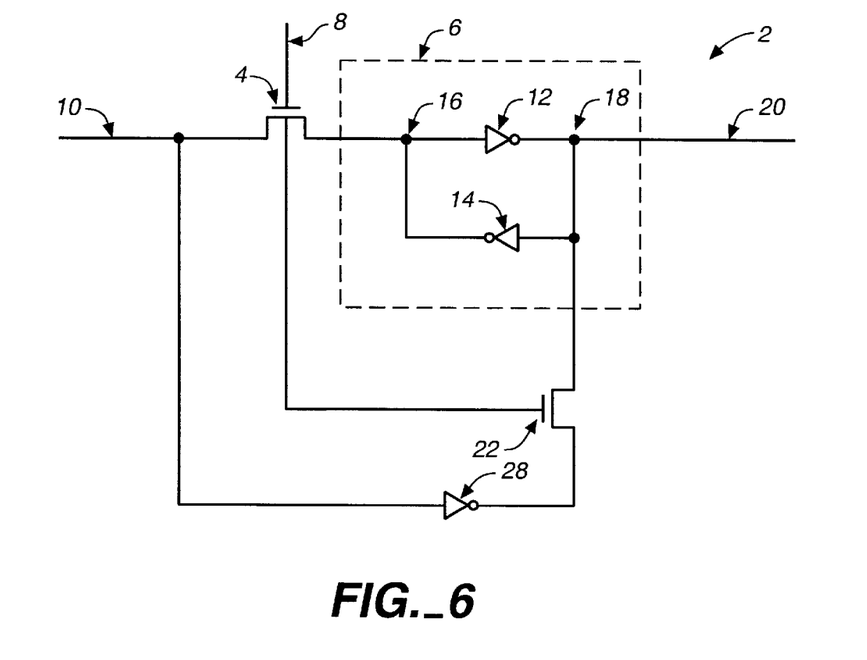
FIG. 6 is a schematic diagram of a FIFO cell having a pull down transistor and a pull down inverter, in accordance with the present invention.

FIG. 6 is a schematic diagram of a FIFO cell having a row select line pull down transistor (22) and a pull down inverter (28), in accordance with the present invention. The gate of the row select line pull down transistor (22) is connected to the row select line (8). The source of the row select line pull down transistor (22) is connected to the output node (18) of the latch cell (6). The drain of the row select line pull down transistor (22) is connected to the output of the pull down inverter (28). The input of the pull down inverter (28) is connected to the data-in line (10). The pull down inverter is a standard inverter and is formed from an NMOS and a PMOS transistor. The configuration of the latch cell (6) with the driver inverter (12), feedback inverter (14), input node (16) and output node (18) is as described above with respect to FIG. 5. Similarly, the connections of the source, drain and gate of the pass gate transistor (4) are as described above with respect to FIG. 5.

In writing a digital "1" to the FIFO cell (2) shown in FIG. 6, a voltage high is provided on the data in line (10). The pass gate transistor (4) is turned on by providing a control signal, represented by a voltage high, on the row select line (8) to the gate of the NMOS pass gate transistor (4). The voltage high from the data-in line (10) passes through the on pass gate transistor (4) and raises the input node (16) of the latch cell (6). This voltage high of the input node (16) is input to the driver inverter (12). the driver inverter (12) outputs a voltage low to the output node (18) and to the feedback inverter (14). The feedback inverter (14) outputs a voltage high to the input node (16). In this manner, the feedback inverter (14) maintains the voltage high of the input node (16). The voltage high of the data-in line (10) is input the pull down inverter (28), which outputs a voltage low. The voltage high of the control signal from the row select line (8) is input to the gate of the row select line pull down transistor (22). This turns on the row select line pull down transistor (22) and connects the output node (18) of the latch cell (6) to the output of the pull down inverter (28). As the output of the pull down inverter (28) is a voltage low, the turning on of the row select line pull down inverter acts to pull down the voltage of the output node (18) of the latch cell (6).

In writing a digital "0" to the FIFO cell (2) shown in FIG. 6, a voltage low is provided on the data in line (10). The pass gate transistor (4) is turned on by providing a control signal, represented by a voltage high, on the row select line (8) to the gate of the NMOS pass gate transistor. The voltage low from the data-in line (10) passes through the on pass gate transistor (4) and lowers the input node (16) of the latch cell (6). This voltage low of the input node (16) is input to the driver inverter (12). The driver inverter (12) outputs a voltage high to the output node (18) and to the feedback inverter (14). The feedback inverter (14) outputs a voltage low to the input node (16). In this manner, the feedback inverter (14) maintains the voltage low of the input node (16). The voltage low of the data-in line (10) is input the pull down inverter (28), which outputs a voltage high. The voltage high from the row select line (8) is input to the gate of the row select line pull down transistor (22). This turns on the row select line pull down transistor (22) and connects the output node (18) of the latch cell (6) to the output of the pull down inverter (28). As the output of the pull down inverter (28) is a voltage high, the turning on of the row select line pull down inverter acts to drive high the voltage of the output node (18) of the latch cell (6).

If a digital "0" was previously written to the latch cell (6) of the FIFO cell (2) of FIG. 6, the writing of a digital "1" to the latch cell must overcome the voltage low at the input node (16) sustained by the feedback inverter (14). To "flip" the cell the row select pull down transistor (22) is turned on, thereby connecting the output node (18) to a voltage low output from the pull down inverter (28). The voltage low from the pull down inverter (28) lowers the output node (18). This voltage low of the output node is input to the feedback inverter (14). The feedback inverter (14) outputs a voltage high to the input node (16) which, along with the voltage high from the data-in line (10), raises the input node (16). This "flips" the latch cell such that a digital "1" has been written into the cell.

Figure 7:
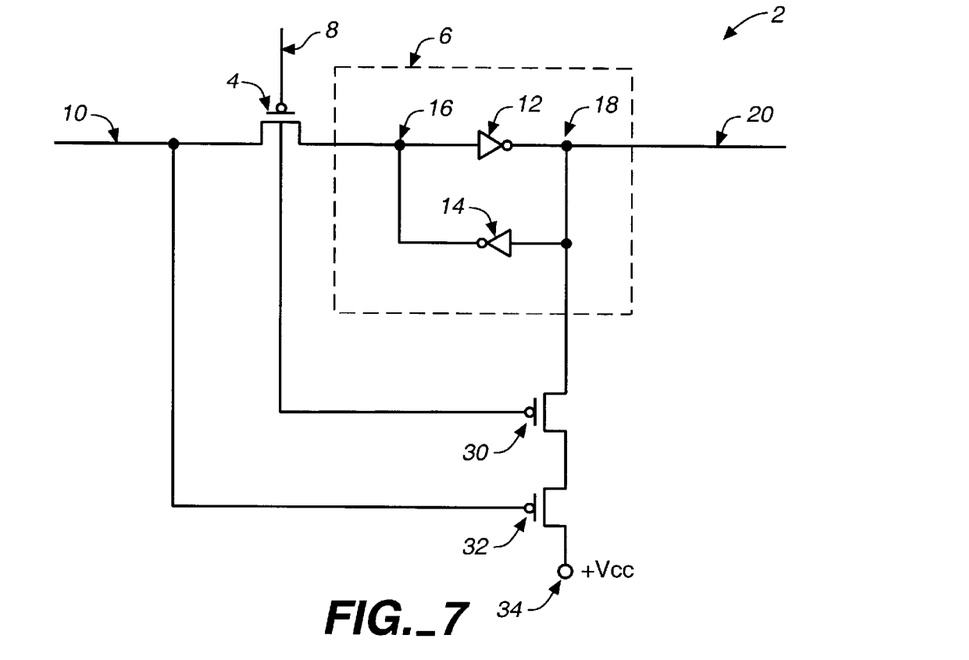
FIG. 7 is a schematic diagram of a FIFO cell having two pull up transistors, in accordance with the present invention.

FIG. 7 is a schematic diagram of a FIFO cell (2) having two pull up transistors, in accordance with the present invention. The FIFO cell (2) is similar to the FIFO cell of FIG. 5 and differs by having the pass gate transistor (4) constructed from a PMOS transistor. The FIFO cell (2) also differs from the FIFO cell of FIG. 5 by having a row select line pull up transistor (30) and a data-in line pull up transistor (32) connecting the output node (18) of the latch cell (6) to a voltage source (34). Unlike the FIFO cell of FIG. 5, the row select line pull up transistor (30) and the data-in line pull up transistor (32) are both formed from PMOS transistors. The voltage source (34) provides a predetermined voltage high, such as $V_{CC}$. The gate of the data-in line pull up transistor (32) is connected to the data-in line (10). The source of the data-in line pull up transistor (32) is connected to the voltage source (34). The drain of the data-in line pull up transistor (32) is connected to the source of the row select line pull up transistor (30). The gate of the row select line pull up transistor (30) connects to the row select line (8). The drain of the row select line pull up transistor (30) connects to the output node (18) of the latch cell (6) of the FIFO cell (2). In this manner, the row select pull up transistor (30) and the data-in line pull up transistor (32) act as a switch to connect the output node (18) of the latch cell to the voltage high (34). The driver inverter (12) and the feedback inverter (14) are both standard CMOS inverters which consist of a NMOS transistor and a PMOS transistor.

Writing a digital "1" into the FIFO cell (2) is accomplished by a voltage high, representing a digital "1," is input to the cell on the data-in line (10). The PMOS pass gate transistor (4) is turned on to allow writing to the cell by applying a control signal, represented by a voltage low, to the gate of the PMOS pass gate transistor (4) from the row select line (8). The turning on of the pass gate transistor (4) raises the voltage of the input node (16) of the latch cell (6). This voltage high input the input node (16) is input the driver inverter (12). The output from the driver inverter (12) is then a voltage low, which is input to the feedback inverter (14) and which pulls down the output node (18). The feedback inverter (14) outputs a voltage high which raises the input node (16). In this manner, the digital "1" is maintained by feedback inverter (14). The voltage low on the row select line (8) is input to the gate of the row select line pull up transistor (8). The voltage low of the control signal on the gate of the PMOS row select line pull up transistor (30) turns on the transistor and electrically connects the output node (18) of the latch cell (6) to the drain of the data-in line pull up transistor (32). The voltage high of the data-in line (10) is input to the gate of the data-in line pull up transistor (32). A voltage high on the gate of the PMOS data-in line pull up transistor (32) closes the transistor, thereby electrically isolating the latch cell (6) from the voltage source (34). In this manner, a digital "1" is written to the latch cell (6).

In contrast to the FIFO cell (2) shown in FIG. 5, the difficulty in "flipping" the latch cell (6) occurs when a digital "0" is to be written into the latch cell that already has a digital "1" written into it. This difficulty occurs due to the inability of the pass gate transistor (4) to pass sufficient current to overcome the voltage low of the input node (16) maintained by the feedback inverter (14). To overcome this difficulty, the row select line pull up transistor (30) and the data-in line pull up transistor (32) are used to pull the output node (18) up by connecting the output node to a voltage high. The voltage high is represented by the voltage source (34). To write a digital "0" to the latch cell (6), a voltage low is input on the row select line (8) to turn on the PMOS pass gate transistor (4). A voltage low input to the pass gate transistor (4) from the data-in line (10) passes through the on pass gate transistor (4) to the input node (16) of the latch cell (6). The voltage low at the input node (16) is input to the driver inverter (12). The output of the driver inverter (12) is a voltage high, which is input to the output node (18) and to the feedback inverter (14). The feedback inverter (14) outputs a voltage low to the input node (16) and to the driver inverter (12). In this manner, the feedback inverter (12) maintains the voltage low if the input node (16). The voltage low on the row select line (8) is input to the gate of the row select line pull up transistor (8). As discussed above, the voltage low of the control signal on the gate of the PMOS row select line pull up transistor (30) turns on the transistor and electrically connects the output node (18) of the latch cell (6) to the drain of the data-in line pull up transistor (32). The voltage low of the data-in line (10) is input to the gate of the data-in line pull up transistor (32). A voltage low on the gate of the PMOS data-in line pull up transistor (32) turns on the transistor, thereby completing the connection between the output node (18) and the voltage source (34) The voltage high from the voltage source (34) pulls the output node (18) of the latch cell (6). The voltage high of the output node (18) is input to the feedback inverter (14). The feedback inverter (14) outputs a voltage low to the input node (16). The voltage low output from the feedback inverter (14), along with the voltage low from the data-in line (10), lowers the input node (16) and flips the latch cell (6). In this manner, a digital "0" is written to the latch cell (6).

Figure 8:
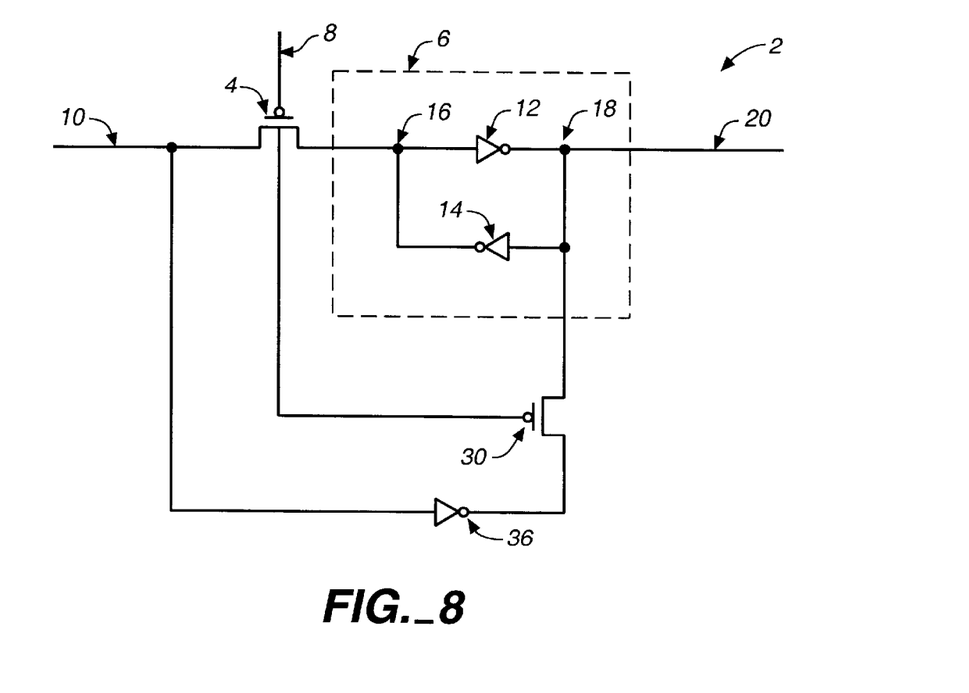
FIG. 8 is a schematic diagram of a FIFO cell having a pull up transistor and a pull up inverter, in accordance with the present invention.

FIG. 8 is a schematic diagram of a FIFO cell (2) having a pull up transistor and a pull up inverter, in accordance with the present invention. The FIFO cell (2) shown in FIG. 8 differs from the FIFO cell shown in FIG. 6 by using PMOS transistors for the pass gate transistor (4) and for a row select line pull up transistor (30). The gate of the row select line pull up transistor (30) connects to the row select line (8). The output node (18) of the latch cell (6) connects to the drain of the row select line pull up transistor (30). The source of the row select line pull up transistor (30) connects to the output of a pull up inverter (36). The input of the pull up inverter (36) connects to the data-in line (10).

In writing a digital "1" to the FIFO cell (2) shown in FIG. 8 a voltage high is provided on the data in line (10). The PMOS pass gate transistor (4) is turned on by providing a control signal, represented by voltage low, on the row select line (8) to the gate of the PMOS pass gate transistor (4). The voltage high from the data-in line (10) passes through the on pass gate transistor (4) and raises the input node (16) of the latch cell (6). This voltage high of the input node (16) is input to the driver inverter (12). The driver inverter (12) outputs a voltage low to the output node (18) and to the feedback inverter (14). The feedback inverter (14) outputs a voltage high to the input node (16). In this manner, the feedback inverter (14) maintains the voltage high of the input node (16). The voltage high of the data-in line (10) is input to the pull up inverter (36), which outputs a voltage low. The voltage low of the control signal from the row select line (8) is input to the gate of the row select line pull up transistor (30). This turns on the PMOS row select line pull up transistor (30) and connects the output node (18) of the latch cell (6) to the output of the pull up inverter (36). As the output of the pull up inverter (36) is a voltage low, the turning on of the row select line pull up inverter acts to pull down the voltage of the output node (18) of the latch cell (6). In this manner, a digital "1" is written to the latch cell (6).

In writing a digital "0" to the FIFO cell (2) shown in FIG. 8 a voltage low is provided on the data in line (10). The PMOS pass gate transistor (4) is turned on by providing a voltage low on the row select line (8) to the gate of the pass gate transistor. The voltage low from the data-in line (10) passes through the on pass gate transistor (4) and lowers the input node (16) of the latch cell (6). This voltage low of the input node (16) is input to the driver inverter (12). The driver inverter (12) outputs a voltage high to the output node (18) and to the feedback inverter (14). The feedback inverter (14) outputs a voltage low to the input node (16). In this manner, the feedback inverter (14) maintains the voltage low of the input node (16). The voltage low of the data-in line (10) is input to the pull up inverter (28), which outputs a voltage high. The voltage low of the control signal from the row select line (8) is input to the gate of the row select line pull up transistor (30). This turns on the PMOS row select line pull up transistor (30) and connects the output node (18) of the latch cell (6) to the output of the pull up inverter (36). As the output of the pull up inverter (36) is a voltage high, the turning on of the row select line pull up inverter acts to raise the voltage of the output node (18) of the latch cell (6).

If a digital "0" was previously written to the latch cell (6) of the FIFO cell (2) of FIG. 8, the writing of a digital "1" to the cell must overcome the voltage low at the input node (16) sustained by the feedback inverter (14). To "flip" the cell the row select pull down transistor (30) is turned on, thereby connecting the output node (18) to the voltage low output from the pull down inverter (36). The voltage low from the pull down inverter (36) pulls down the output node (18). The voltage low of the output node (18) is input to the feedback inverter (14). The feedback inverter (14) outputs a voltage high to the input node (16). The voltage high from the feedback inverter (14), along with the voltage high from the data-in line (10), raises the input node (16), thereby flipping the latch cell (6).

Although the invention has been described in conjunction with particular embodiments, it will be appreciated that various modifications and alterations may be made by those skilled in the art without departing from the spirit and scope of the invention.

The invention claimed is:

1. A memory cell comprising:
a latch having an input for receiving a data signal, and further having a latch output; and
a switch for coupling the latch output to a predetermined potential in response to the data signal and a control signal, wherein the switch comprises an inverter.

2. The memory cell of claim 1, further comprising a passing gate for coupling the data signal to the latch input in response to the control signal.

3. The memory cell of claim 1, wherein coupling the latch output to the predetermined potential pulls the output towards the predetermined potential.

4. The memory cell of claim 1, wherein the switch further comprises a first switching transistor responsive to the control signal, further wherein the inverter is responsive to the data signal, and an output of the inverter is coupled to the first switching transistor so as to provide the predetermined potential.

5. The memory cell of claim 2, wherein the switch further comprises a first switching transistor responsive to the control signal, further wherein the inverter is responsive to the data signal, and an output of the inverter is coupled to the first switching transistor so as to provide the predetermined potential.

6. The memory cell of claim 1, wherein the switch couples the latch output to the predetermined potential in response to a logic 1 data signal.

7. The memory cell of claim 1, wherein the switch couples the latch output to the predetermined potential in response to a logic 0 data signal.

8. The memory cell of claim 1, wherein the memory cell is part of an array of memory cells, and the control signal is a select signal.

9. The memory cell of claim 8, wherein the control signal is a row select signal.

10. The memory cell of claim 1, wherein the predetermined potential is a low potential.

11. The memory cell of claim 10, wherein the low potential is ground potential.

12. The memory cell of claim 1, wherein the predetermined potential is a high potential.

13. The memory cell of claim 12, wherein the high potential is Vcc.

14. The memory cell of claim 1, wherein the memory cell is part of a plurality of memory cells in a FIFO chain.

15. The memory cell of claim 14, wherein all of the memory cells in the FIFO chain are of the type of memory cell of claim 1.

16. A memory cell, comprising:
a data-in line;
a row select line;
a data-out line;
a latch cell having an input node, and an output node;
a pass gate transistor, wherein a gate of the pass gate transistor is connected to the row select line and wherein the pass gate transistor is connected to the data-in line and the input node of the latch cell such that when the pass gate transistor is turned on the input node of the latch cell is electrically connected to the data-in line; and
a switch comprising an inverter,
wherein the switch is connected between the output node of the latch cell and a predetermined voltage such that, when the switch is turned on in response to a control signal applied on the row select line and a data signal applied on the data-in line, the output node of the latch cell is electrically connected to the predetermined voltage.

17. The memory cell of claim 16; wherein the switch further comprises a first switching transistor responsive to the control signal, further wherein the inverter is connected to the data-in line, and an output of the inverter is coupled to the first switching transistor so as to provide the predetermined voltage.

18. The memory cell of claims 17, wherein the predetermined voltage is a voltage low.

19. The memory cell of claim 1, wherein the predetermined voltage is a voltage high.

20. A method of writing to a memory cell, comprising the steps of:

inputting a data signal to a latch, the latch having an output; and coupling the latch output to a predetermined potential in response to the data signal and a control signal, wherein the coupling comprises coupling an output of an inverter to a first switching transistor.

21. The method of writing to a memory cell of claim 20, further comprising the step of:

coupling the data signal to a latch input in response to the control signal.

22. The method of writing to a memory cell of claim 20, wherein coupling the latch output to the predetermined potential pulls the output towards the predetermined potential.

23. The method of writing to a memory cell of claim 20, wherein the first switching transistor is responsive to the control signal and the inverter is responsive to the data signal.

24. The method of writing to a memory cell of claim 21, wherein coupling the output of the inverter to the first switching transistor provides the predetermined potential, further wherein the first switching transistor is responsive to the control signal and the inverter is responsive to the data signal.

25. The method of writing to a memory cell of claim 20, wherein the switch couples the latch output to the predetermined potential in response to a logic 1 data signal.

26. The method of writing to a memory cell of claim 20, wherein the switch couples the latch output to the predetermined potential in response to a logic 0 data signal.

27. The method of writing to a memory cell of claim 20, wherein the memory cell is part of an array of memory cells, and the control signal is a select signal.

28. The method of writing to a memory cell of claim 27, wherein the control signal is a row select signal.

29. The method of writing to a memory cell of claim 20, wherein the predetermined potential is a low potential.

30. The method of writing to a memory cell of claim 29, wherein the low potential is ground potential.

31. The method of writing to a memory cell of claim 20, wherein the predetermined potential is a high potential.

32. A method of writing to a memory cell, comprising the steps of:

providing a data signal on a data-in line; and providing a control signal on a row select line to allow the data signal on the data-in line to pass through a pass gate transistor to the latch cell;

wherein the control signal and the data in signal operate a switch which connects an output of a latch cell of the memory cell to a predetermined voltage, further wherein the predetermined voltage is provided by an inverter coupled to the data signal.

33. The method of claim 32, wherein the predetermined voltage is a voltage low.

34. The method of claim 32, wherein the predetermined voltage is a voltage high.

35. A programmable logic device, comprising:

a plurality of regions of configurable logic;

a plurality of programmable logic connectors;

a plurality of memory cells associated with the plurality of regions of configurable logic and the plurality of programmable logic connectors, each memory cell comprising:

a data-in line;

a pass gate transistor;

a row select line coupled to the gate of the pass gate;

a latch cell coupled to the data-in line through the pass gate transistor, the latch cell having an input node and an output node;

a data-in line pull down inverter; and a row select line pull down transistor;

wherein the data-in line pull down inverter provides a predetermined voltage to the output node of the latch cell via the row select line pull down transistor such that the output node is pulled down when writing a digital 1 to the latch cell.

36. The programmable logic device of claim 35, wherein the predetermined voltage is a voltage low.

37. A digital system comprising:

a memory;

a processing unit connected to the memory, the processing unit having at least one programmable logic device comprising:

a plurality of regions of configurable logic;

a plurality of programmable logic connectors;

a plurality of memory cells associated with the plurality of regions of configurable logic and the plurality of programmable logic connectors, the memory cells comprising:

a latch having an input for receiving a data signal, and further having an output; and a switch for coupling the latch output to a predetermined potential in response to the data signal and a control signal, wherein the switch comprises an inverter.

38. The digital system of claim 37, wherein the switch further comprises a first switching transistor responsive to the control signal, further wherein the inverter is responsive to the data signal, and an output of the inverter is coupled to the first switching transistor so as to provide the predetermined potential.

39. The digital system of claim 37, wherein the switch couples the latch output to the predetermined potential in response to a logic 1 data signal.

40. The digital system of claim 37, wherein the switch couples the latch output to the predetermined potential in response to a logic 0 data signal.

41. The digital system of claim 37, further comprising:

an input/output device coupled to the processing unit.

42. A method of writing to a memory cell, comprising the steps of:

inputting a data signal to a latch;

coupling the latch output to a predetermined potential in response to the data signal and a control signal, wherein the predetermined voltage is provided by an inverter coupled to the data signal.

43. The method of claim 42, wherein the switch couples the latch to the predetermined potential in response to a logic 1 data signal.

44. The method of claim 43, wherein the predetermined potential is a voltage low.

45. The method of claim 42, wherein the switch couples the latch to the predetermined potential in response to a logic 0 data signal.

46. The method of claim 45, wherein the predetermined potential is a voltage high.

47. The method of claim 43, wherein the predetermined potential is electrical ground.

48. A memory cell comprising:

a latch having an input for receiving a data signal, and further having an output; and a switch for coupling the latch output to a predetermined potential in response to the data signal and a control signal, wherein the predetermined potential is substantially equal to Vcc.

49. A memory cell, comprising:

a data-in line;

a row select line;

a data-out line;

a latch cell having an input node, and an output node;

a pass gate transistor, wherein a gate of the pass gate transistor is connected to the row select line and wherein the pass gate transistor is connected to the data-in line and the input node of the latch cell such that when the pass gate transistor is turned on the input node of the latch cell is electrically connected to the data-in line; and a switch, wherein the switch is connected between the output node of the latch cell and a predetermined voltage such that when the switch is turned on the output node of the latch cell is electrically connected to the predetermined voltage, wherein the predetermined potential is substantially equal to Vcc.

50. A method of writing to a memory cell, comprising the steps of:

inputting a data signal to a latch, the latch having an output; and coupling the latch output to a predetermined potential in response to the data signal and a control signal, wherein the predetermined potential is substantially equal to Vcc.

51. A method of writing to a memory cell, comprising the steps of:

providing a data signal on a data-in line; and providing a control signal on a row select line to allow the data signal on the data-in line to pass through a pass gate transistor to the latch cell;

wherein the control signal and the data in signal operate a switch which connects an output of a latch cell of the memory cell to a predetermined voltage, wherein the predetermined potential is substantially equal to Vcc.

52. A method of writing to a memory cell, comprising the steps of:

inputting a data signal to a latch;

coupling the latch output to a predetermined potential in response to the data signal and a control signal, wherein the predetermined potential is substantially equal to Vcc.

53. A digital system comprising: a programmable logic device (PLD), wherein the PLD comprises a memory cell comprising:

a latch having an input for receiving a data signal, and further having a latch output; and a switch for coupling the latch output to a predetermined potential in response to the data signal and a control signal, wherein the switch comprises an inverter.

\* \* \* \* \*